United States Patent [19]

Abe

[11] Patent Number: 5,056,023
[45] Date of Patent: Oct. 8, 1991

[54] DIAGNOSIS SYSTEM FOR MOTOR VEHICLE

[75] Inventor: Kunihiro Abe, Tokyo, Japan

[73] Assignee: Fuji Jukogyo Kabushiki Kaisha, Tokyo, Japan

[21] Appl. No.: 423,779

[22] Filed: Oct. 18, 1989

[30] Foreign Application Priority Data

Oct. 21, 1988 [JP] Japan .............................. 63-266308

[51] Int. Cl.⁵ ...................... G01M 15/00; G06F 15/20
[52] U.S. Cl. .......................... 364/424.03; 364/431.01; 73/117.3; 340/439
[58] Field of Search ...................... 364/424.01, 424.03, 364/424.04, 550, 551.01, 431.01, 431.04, 431.12; 73/117.2, 117.3; 340/438, 439, 459

[56] References Cited

U.S. PATENT DOCUMENTS

| | | | |
|---|---|---|---|
| 4,894,781 | 1/1990 | Sato et al. ....................... | 364/551.01 |
| 4,899,338 | 2/1990 | Wroblewski ....................... | 340/459 |
| 4,924,391 | 5/1990 | Hirano et al. .................. | 364/551.01 |

*Primary Examiner*—Gary Chin
*Attorney, Agent, or Firm*—Beveridge, DeGrandi & Weilacher

[57] ABSTRACT

There is disclosed a diagnosis system for a motor vehicle, and comprising a plurality of and various electronic control units mounted on the vehicle, and a diagnosis unit connected to the control units and for diagnosing troubles occurring in the several control units. The system further comprises a plurality of communication circuits provided in the diagnosis unit corresponding to every communication systems of the control units, a communication bus provided to connect the control units in parallel to the diagnosis unit, and one external connector for connecting the bus to the diagnosis unit. Accordingly, it is possible for the system to respond to every trouble of the control unit despite different communication systems, without changing connectors, and providing a plurality of communication buses.

7 Claims, 9 Drawing Sheets

DIAGNOSIS SYSTEM FOR MOTOR VEHICLE

BACKGROUND OF THE INVENTION

The present invention relates to a diagnosis system for a motor vehicle, and which is capable of diagnosing trouble in a plurality of electronic control units which are mounted on the motor vehicle.

In conventional technology, the electronic control units control various amounts such as an air-fuel ratio by using a microcomputer. Ordinally, the units have a self-diagnosis function for indicating troubles by lighting or turning on and off a self-diagnosis lamp when trouble occurs in sensors or actuators.

However, it is impossible for users to easily understand an extent such as a position or degree of the trouble by only lighting or turning on and off the lamp. Accordingly, service stations of dealers must have diagnosis systems for vehicles with trouble, and which are capable of easily checking data about the positions or degree of the troubles occurring in the electronic control units. Such diagnosis systems are, for example, disclosed in Japanese Patent Laid-open No. 58-12848 (1983).

However, the motor vehicle has a plurality of control units for controlling an engine, a transmission, a brake, and a steering mechanism. In the case of diagnosing troubles in the control units, a connector of the diagnosis system must be connected one by one to connectors of the control units, and the diagnosis operation is complicated. Furthermore, in the case of diagnosing troubles influencing a plurality of control units, the diagnosis operation is difficult and it takes much time in order to find the trouble. In order to solve problems, the applicant of the present invention has already proposed a diagnosis system comprising a diagnosis unit for finding troubles in the vehicle, a communication bus consisting of a transmitting line and a receiving line, a plurality of control units connected to the communication bus, and a connector provided at an end of the bus for connecting the control units to the diagnosis unit. And the diagnosis system performs a communication between the control units and the diagnosis unit through one connector.

However, the control units have different processing abilities corresponding to controlled systems, respectively, and thereby having different abilities for processing the communication. Accordingly, all control units do not necessarily have the same communication system, so that each unit has a start-stop or a clock synchronous communication system or the like.

Therefore, the control units having the same communication system are capable of being connected to the diagnosis system by one connector. But, it is problem that the diagnosis system needs some connectors corresponding to every communication system when one vehicle has a plurality of the control units respectively having different communication systems.

SUMMARY OF THE INVENTION

An object of the present invention is to provide a diagnosis system capable of accurately diagnosing a plurality of electronic control units and sensors connected thereto in a short time and improving the work efficiency in dependency on the interconnection of a diagnosis unit and a plurality of electronic control units, by only one connector.

In order to achieve the above-mentioned object, the diagnosis system mounted on a motor vehicle according to the present invention having a plurality of electronic control units with different communication systems to each other and a diagnosis unit connected to the control units for diagnosing troubles occurring therein, the diagnosis system comprises a plurality of communication means provided in the diagnosis unit corresponding to the different control units having different communication systems, a single communication bus for connecting the control units in parallel to the bus for connecting the bus to the diagnosis unit.

The external connector connects the bus to the diagnosis unit so that communication corresponding to the different communication systems is capable of diagnosing troubles occurring in the control units of different communication systems.

DETAILED DESCRIPTION OF THE PREFERRED EMBODIMENT

Figure 1A:
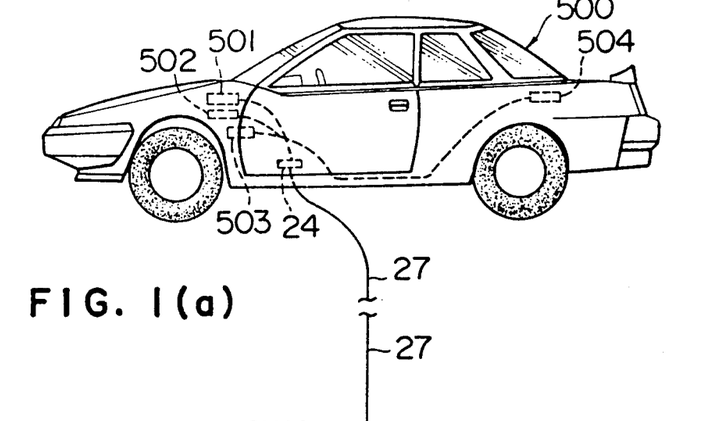
FIG. 1(a) is a side view showing the external appearance of a motor vehicle.

As shown in FIG. 1(a), a motor vehicle 500 provides various types of electronic control units (ECU) such as an engine control unit 501 for air-fuel ratio control or the like, a transmission control unit 502, a brake control unit 503 for anti-skid control, a cruise control unit 504 for driving in a constant speed by calculating various kind data necessary to driving vehicle.

Figures 2, 2B:
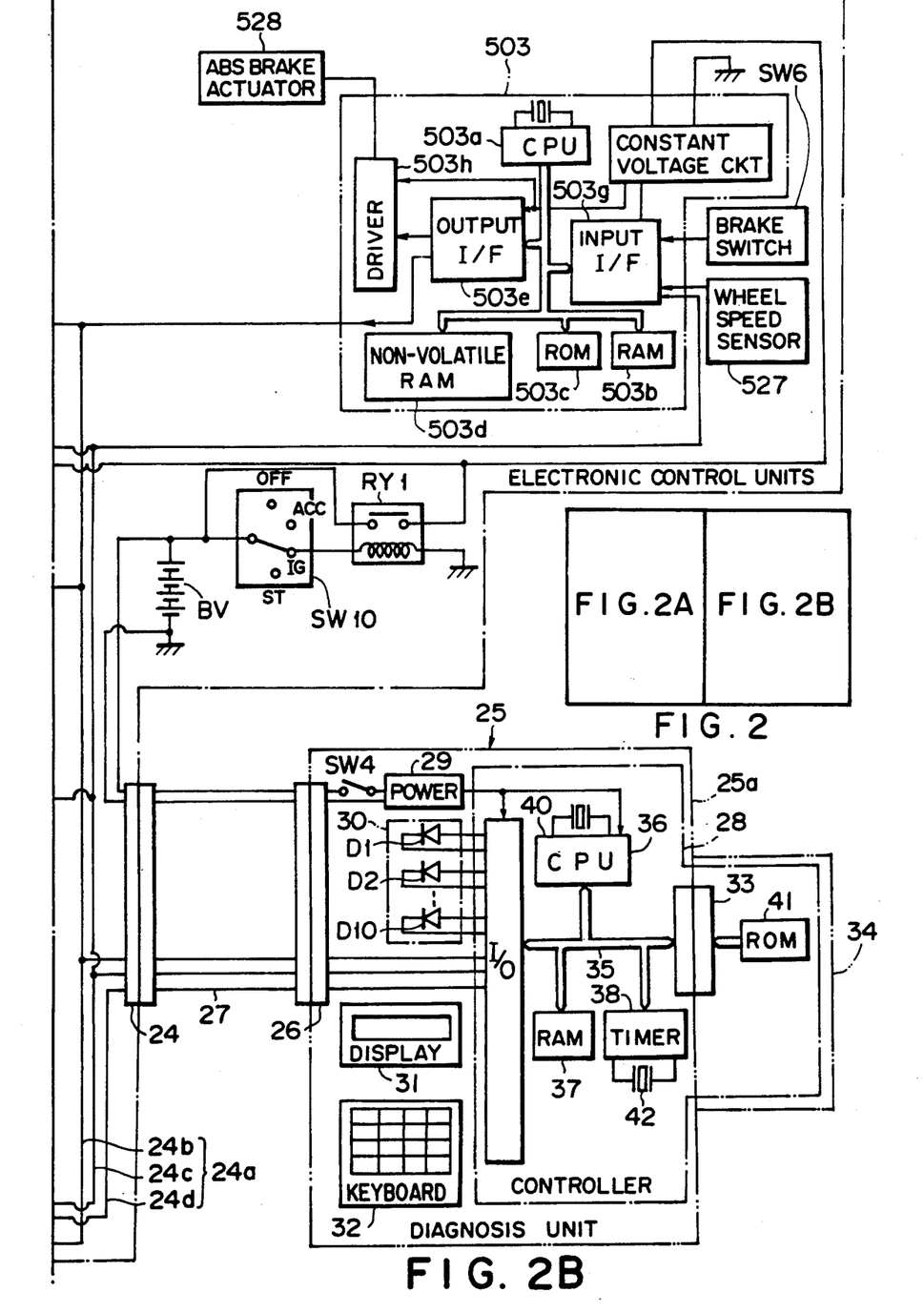
FIGS. 2, 2A and 2B are block diagrams showing a circuit construction of electronic control units of a diagnosis system according to the present invention.
Figure 2A:
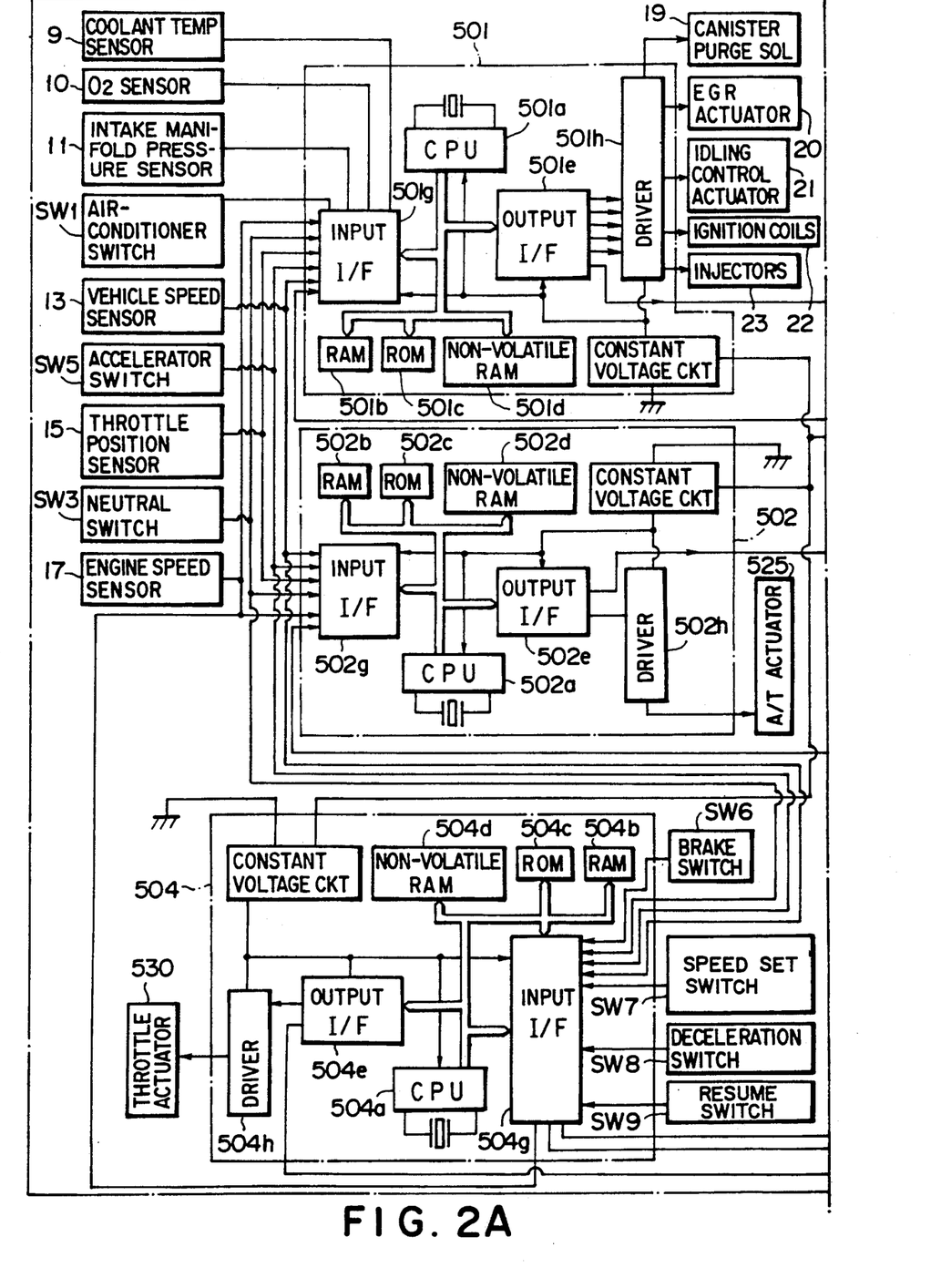

The aforementioned various ECUs 501 to 504 are connected to, as shown in FIGS. 2A and 2B, a power source BV such as a battery via a relay RY1 opened or closed by a key switch SW10. Each ECU 501 to 504 comprises central processing units (CPUs) 501a to 504a, random access memories (RAMs) 501b to 504b, read only memories (ROMs) 501c to 504c, non-volatile RAMs 501d to 504d, input interfaces 501g to 504g, and output interfaces 501e to 504e, respectively. The RAMs 501b to 504b respectively store various temporary parameters after various calculational operation. The non-volatile RAMs 501d to 504d respectively store various control maps. The ROMs 501c to 504c respectively store programs and fixed data.

The ECU 501 receives a plurality of signals, via the input interface 501g, from a coolant temperature sensor 9, an $O_2$ sensor 10, an intake manifold pressure sensor 11, an air conditioner switch SW1, a vehicle speed sensor 13, an accelerator switch SW5, a throttle position sensor 15, a neutral switch SW3, and an engine speed sensor 17. In the ECU 501, the CPU 501a processes data corresponding to the received signals so as to store in the RAM 501b. Then, the CPU 501a performs calculational operation in dependency on the stored data in the RAM 501b and in the control map of the non-volatile RAM 501d. The CPU 501a generates various control signals in dependency on the calculated data and outputs the signals to a canister purge solenoid 19, an EGR (exhaust gas recirculation system) actuator 20, an idling control actuator 21, ignition coils 22, and fuel injectors 23 via the output interface 501e and a driver 501h thereby controlling the engine.

The ECU 502 receives a plurality of signals via the input interface 502g from the sensors 13, 15 and 17 and the switches SW3 and SW5, and outputs transmission signals (commands) to an automatic transmission (A/T) actuator 525 via the output interface 502e and a driver 502h thereby controlling an A/T (not shown) according to the running condition.

The ECU 503 receives a plurality of signals from a brake switch SW6 and a wheel speed sensor 527 via the input interface 503g, and then calculates anti-skid operation according to the control program stored in the ROM 503c to produce a control signal. The ECU 503 outputs the signal to a brake actuator 528 for an antiskid braking system (ABS) via the output interface 503e and a driver 503h thereby controlling a skid of the wheels.

The ECU 504 receives several signals via the input interface 504g from a speed set switch SW7 and the vehicle speed sensor 13, then controls a throttle actuator 530 to run the vehicle in constant speed via the output interface 504e and a driver 504h. When the ECU 504 receives several signals from the brake switch SW6, accelerator switch SW5, neutral switch SW3, deceleration switch SW8, and a resume switch SW9 via the input interface 504g, the ECU 504 removes the control of the constant speed running or reset a constant speed running after charging the speed of the vehicle.

The ECUs 501 to 504 are connected in parallel to a communication bus 24a comprising a transmission line 24b, a reception line 24c and a clock signal line 24d. The reception line 24c is connected in parallel to the input interfaces 501g to 504g, while the transmission line 24b is connected in parallel to the output interfaces 501e to 504e. On the other hand, the clock signal line 24d is connected in parallel to the input interface 504g of the ECU 504.

The communication bus 24a is connected to an external connector 24 which is connected to an input/output connector 26 of a diagnosis unit 25 via an adapter harness 27.

Several service stations of the dealers are equipped with a diagnosis unit 25 having a controller 28 and a power source circuit 29 therein and an indicator 30, a display 31 and a keyboard 32 on the surface thereof.

The controller 28 comprises a CPU 36, a RAM 37, a timer 38 such as a frequency counter and an input/output (I/O) interface 40 which are interconnected to each other, and a memory cartridge 34 externally connectable through a connector 33.

The I/O interface 40 is connected to the input/output connector 26 for transmitting a signal $T_x$ to the bus 24a, for receiving a signal $R_x$ from the bus 24a and for selectively outputting a clock signal CLK. The signal CLK is generated by frequency dividing of an output from a clock pulse oscillating element 42 provided in the timer 38 and generating a synchronous signal. In a clock synchronous communication system, data are transmitted and received in synchronization with the clock signal CLK.

The keyboard 32 is connected to an input side of the I/O interface 40, while the indicator 30 and display 31 are connected to an output side of the interface 40. The interface 40 receives various control signals output from the output interfaces 501e to 504e and the output signals from various sensors and switches. A diagnosis for trouble is performed by displaying data in the display 31 after processing. Light emitting diodes (LEDs) $D_1$ to $D_{10}$ of the indicator 30 are lit (or turned on or off) according to the signals of various switches so that it is possible to confirm operation of the switches.

Since the ECUs 501 to 504 have different diagnosis programs according to vehicle types, the cartridge 34 has a ROM 41 storing a diagnosis program for the ECUs 501 to 504 and fixed data therein and is capable of selectively connecting to the main body 25a.

Furthermore, the power circuit 29 with the controller 28 is connected to the power source BV of the vehicle 500 via an ON/OFF operation switch SW4.

Figure 3:
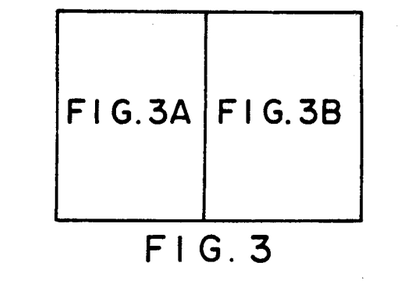
FIGS. 3, 3A and 3B are block diagrams showing functions of the control units and diagnosis unit of the diagnosis system according to the present invention.
Figure 3A:
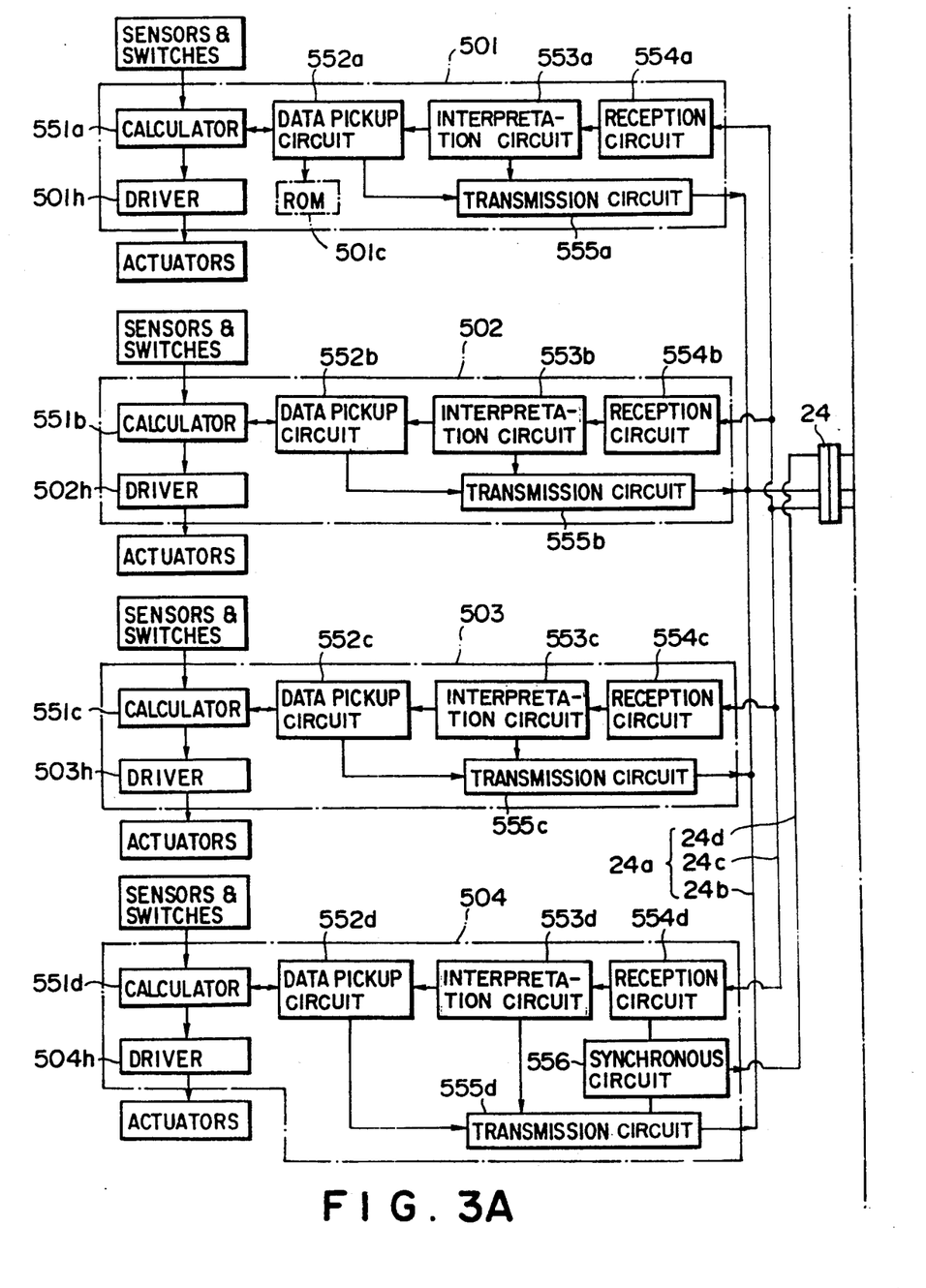
Figure 3B:
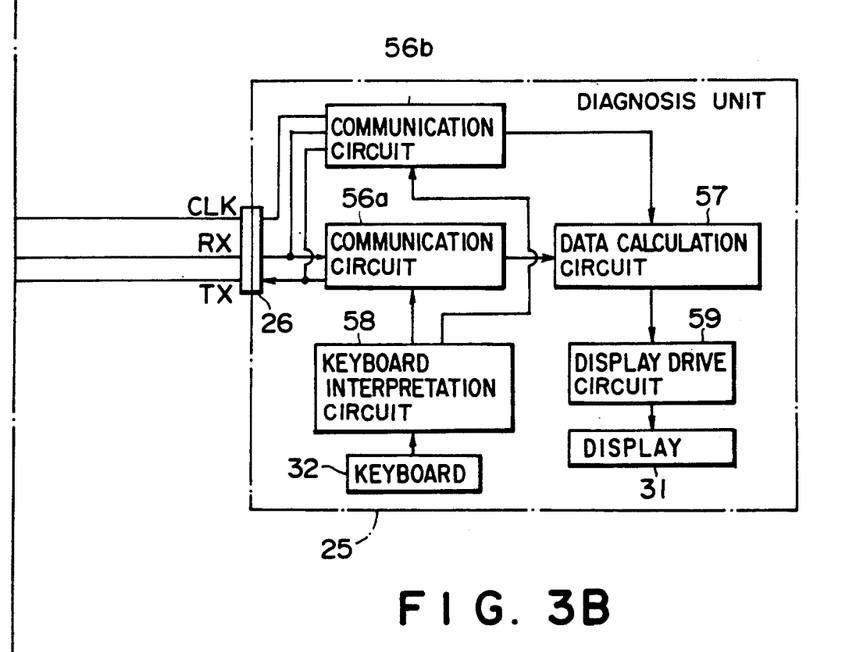

Next, the functions of the electronic control units and diagnosis unit will be described according to FIGS. 3A and 3B.

The ECUs 501 to 504 comprise calculators 551a to 551d for arithmetically processing signals output from several sensors and switches, drivers 501h to 504h for outputting signals corresponding to actuators, data pickup circuits 552a to 552d, interpretation circuits 553a to 553d, reception circuits 554a to 554d, and transmission circuits 555a to 555d, respectively. In the ECU 504, the reception circuit 554d and transmission circuit 555d are interconnected to each other through synchronization circuit 556.

The reception circuits 554a to 554d are connected in parallel to the reception line 24c of the communication bus 24a, respectively, while the transmission circuits 555a to 555d are connected in parallel to the transmission line 24b of the bus 24a, respectively. On the other hand, the synchronization circuit 556 is connected to the clock signal line 24d of the bus 24a and synchronizes the reception circuit 554d and the transmission circuit 555d of the ECU 504 with the clock signal CLK transmitted together with the data thereby transmitting and receiving the data.

The diagnosis unit 25 comprises communication circuits 56a and 56b, a data calculation circuit 57, a keyboard interpretation circuit 58, a display drive circuit 59, the keyboard 32, and the display 31. The communication circuit 56a has a transmission line and reception line connected to the input/output connector 26, while the communication circuit 56b has a transmission line, a reception line and a clock signal line connected to the input/output connector 26.

As the processing abilities of the ECU 501 to 504 are different from each other, there are applied two kinds of the different communication systems such as a start-stop synchronous type and a clock synchronous type.

Namely, a communication between the ECUs 501 to 503 and the diagnosis unit 25 is performed by the start-stop synchronous system through the communication circuit 56a, while a communication between the ECU 504 and the diagnosis unit 25 is performed by the clock synchronous system through the communication circuit 56b.

Figure 4:
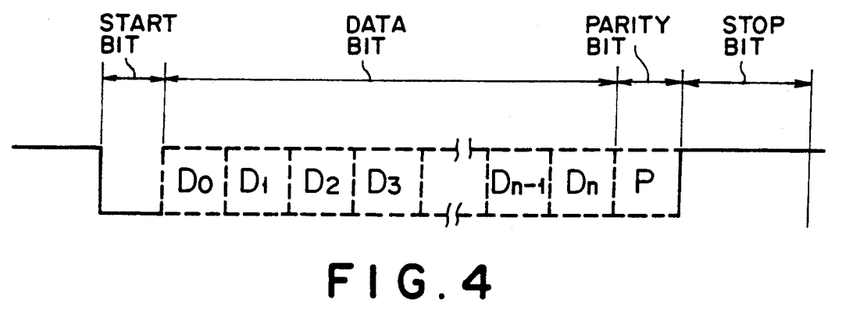
FIG. 4 is an explanatory diagram showing a data format in a start-stop synchronous communication system of the diagnosis system according to the present invention.

As shown in FIG. 4, the start-stop synchronous system has a data format where a start bit added to every one letter, data of the letter constructed by, for example, eight bits, an error detection bit such as a parity bit, and a stop bit are successively transmitted. In the start-stop system, the communication circuit 56a receives data in every synchronous letter.

Figure 5:
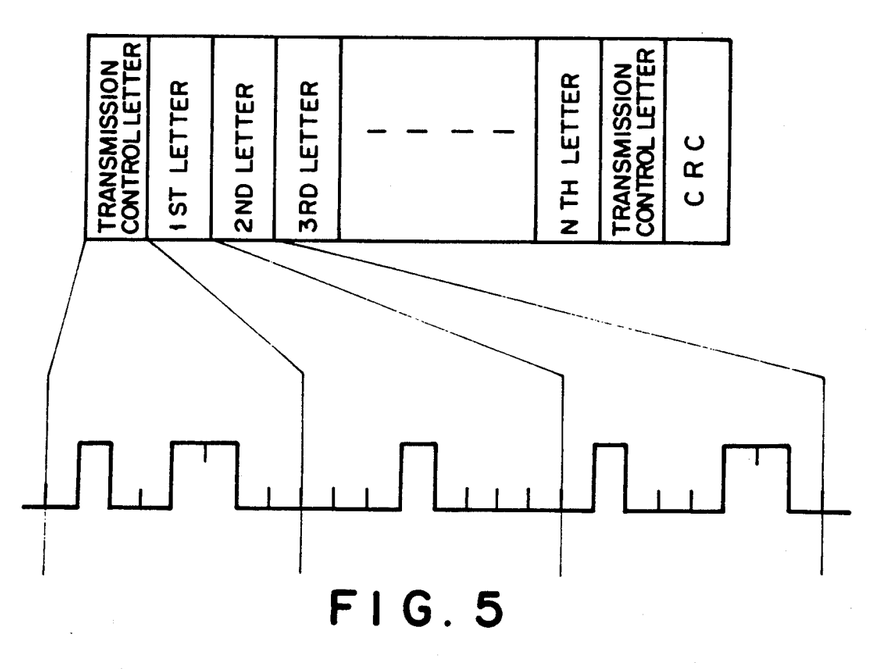
FIG. 5 is an explanatory diagram showing a data format in a clock synchronous communication system of the diagnosis system according to the present invention.

On the other hand, the clock synchronous system has a data format, as shown in FIG. 5, in which a transmission control letter showing a start of data is firstly transmitted for every one group of a letter line, and then the letter line having a first to n-th letters is successively transmitted. After transmitting the last transmission control letter indicating an end of data, an error detection bit such as a CRC check is lastly transmitted. In the clock synchronous system, the data and synchronous signals (clock signals) are transmitted at the same time with respective line, and the communication circuit 56b receives the data in synchronous with the clock signals.

For example, if all ECU 501 to 504 are constructed by the start-stop synchronous system, as the start-stop system must receive the data letter by letter in synchronization with a bit, it is possible for the ECU 504 having low communication ability to generate an untimely data reception error because of transmitting the data at the same transmission speed as the control unit such as the ECU 501 having high processing ability. On the contrary, if the transmission speed is fitted to the ECU 504, since the ECU 501 having a high processing ability increases the waiting time, an overhead time of the operation increases. Accordingly, if the data are transmitted in synchronization with the clock signal at the speed fitted to a processing ability of the ECU 504, the ECU 504 can receive the data accurately.

Accordingly, in the ECU 501 to 504 having either a start-stop or clock synchronous communication system, the reception circuits 554a to 554d receive various order signals from the diagnosis unit 25, and the interpretation circuits 553a to 553d interpret the contents of the various order signals, respectively. The interpretation circuits 553a to 553d instruct a pickup of the predetermined data to the data pickup circuits 552a to 552d according to the interpreted contents. The data pickup circuits 552a to 552d pick up various data calculated by the calculator 551a to 551d or the fixed data stored in the ROM 501c to 504c thereby transmitting the data to the diagnosis unit 25 via the transmission circuits 555a to 555d.

In the diagnosis unit 25, the interpretation circuit 58 interprets the diagnosis mode supplied from the keyboard 32 to determine the control unit corresponding to the diagnosis mode from any of the ECU 501 to 504 thereby selecting the communication circuit 56a or 56b responsive to the communication type thereof. As a result, the ECUs 501 to 503 receive various demand signals from the communication circuit 56a by the start-stop synchronous system, while the ECU 504 receives the various demand signals from the communication circuit 56b by the clock synchronous system. When the communication circuit 56a or 56b receives the data transmitted from one of the ECUs 501 to 504 responsive to the various demand signals, the data are calculated by the data calculation circuit 57 thereby displaying in the display 31 through the display drive circuit 59.

Figure 6:
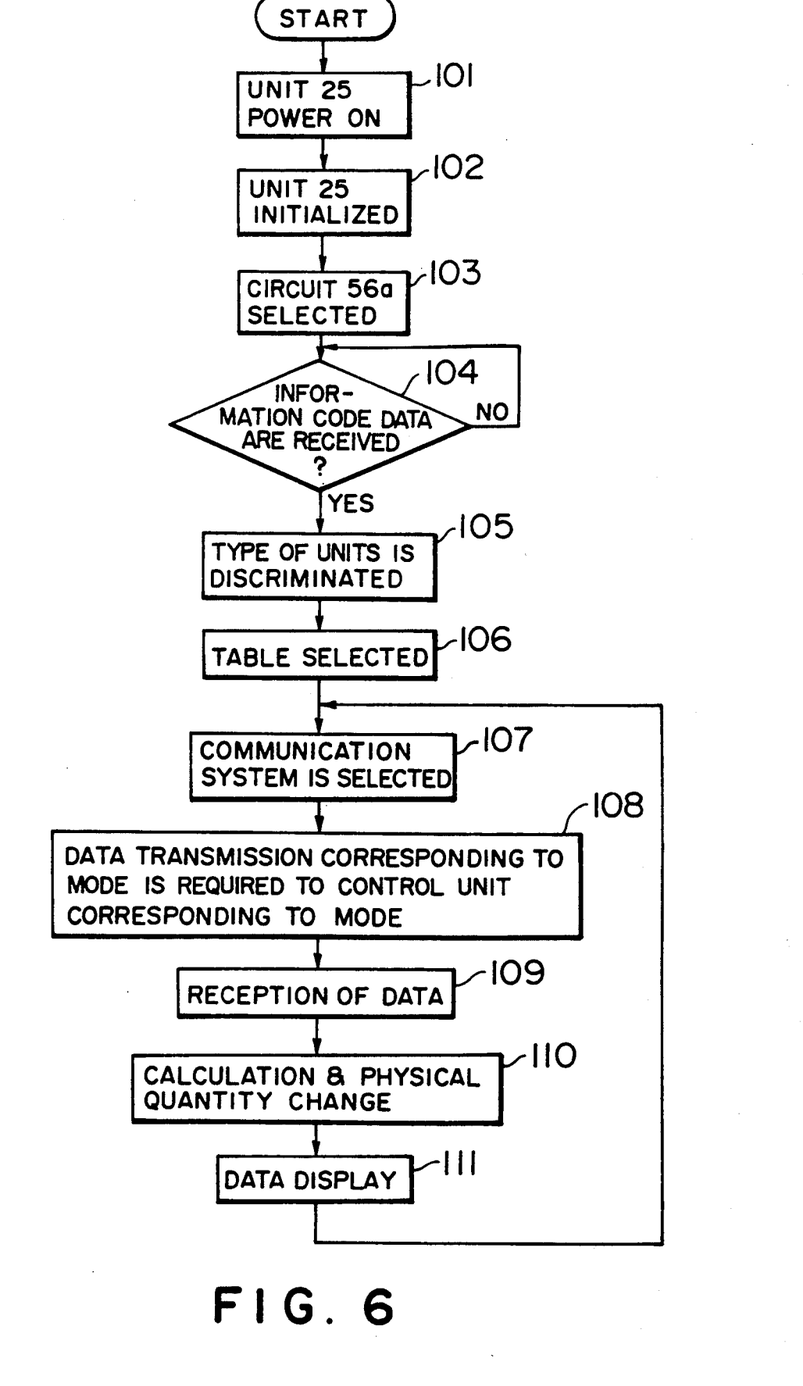
FIG. 6 is a flow chart showing an operational procedure of the diagnosis unit of the diagnosis system according to the present invention.
Figure 7:
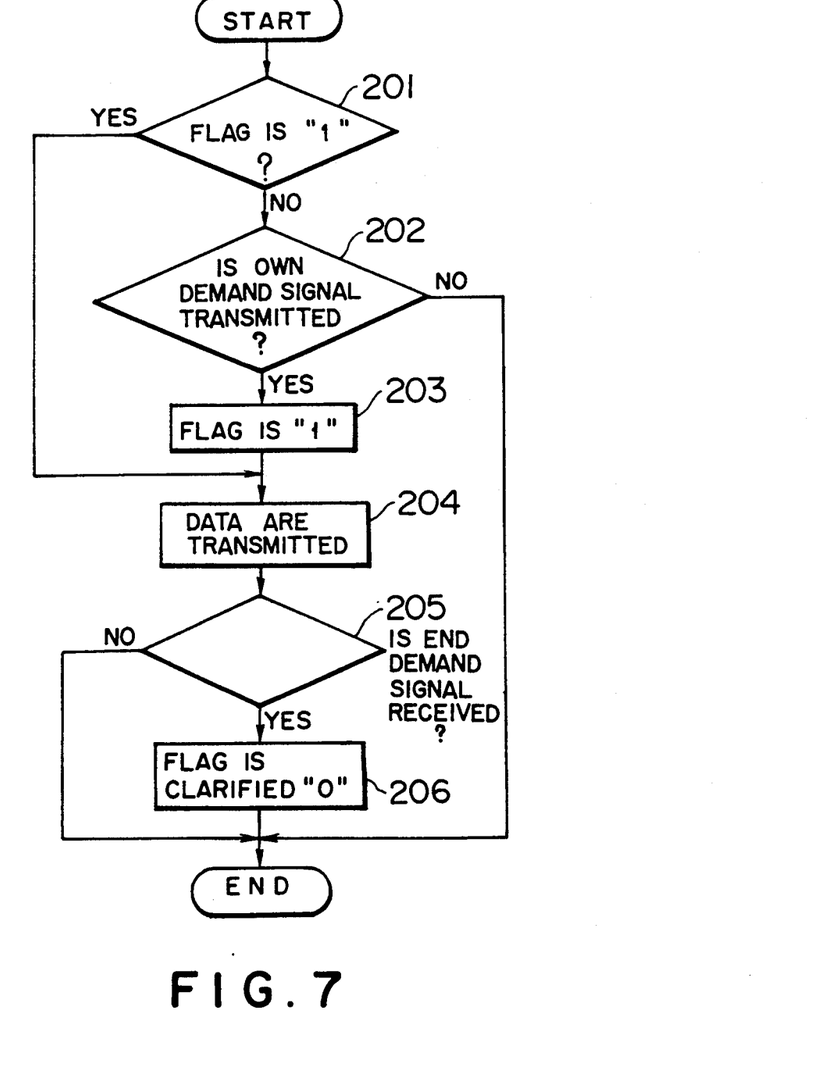
FIG. 7 is a flow chart showing an operational procedure of the electronic control unit of the diagnosis system according to the present invention.

Next, the operation of the aforementioned construction will be described according to flow charts as shown in FIGS. 6 and 7.

Before performing a program, the input/output connector 26 of the diagnosis unit 25 is connected to the external connector 24 of the vehicle 500 directly or through the adapter harness 27.

Next, the diagnosis unit 25 has the power turned on (step 101), and initialized (step 102). Then, the communication circuit 56a is automatically selected and outputs a unit identification code demand signal to the ECU 501 (step 103). Namely, as the unit identification code is stored in the ROM 501c of the ECU 501 in advance and the ECU 501 has the start-stop synchronous communication system, the communication circuit 56a is selected.

Figure 8:
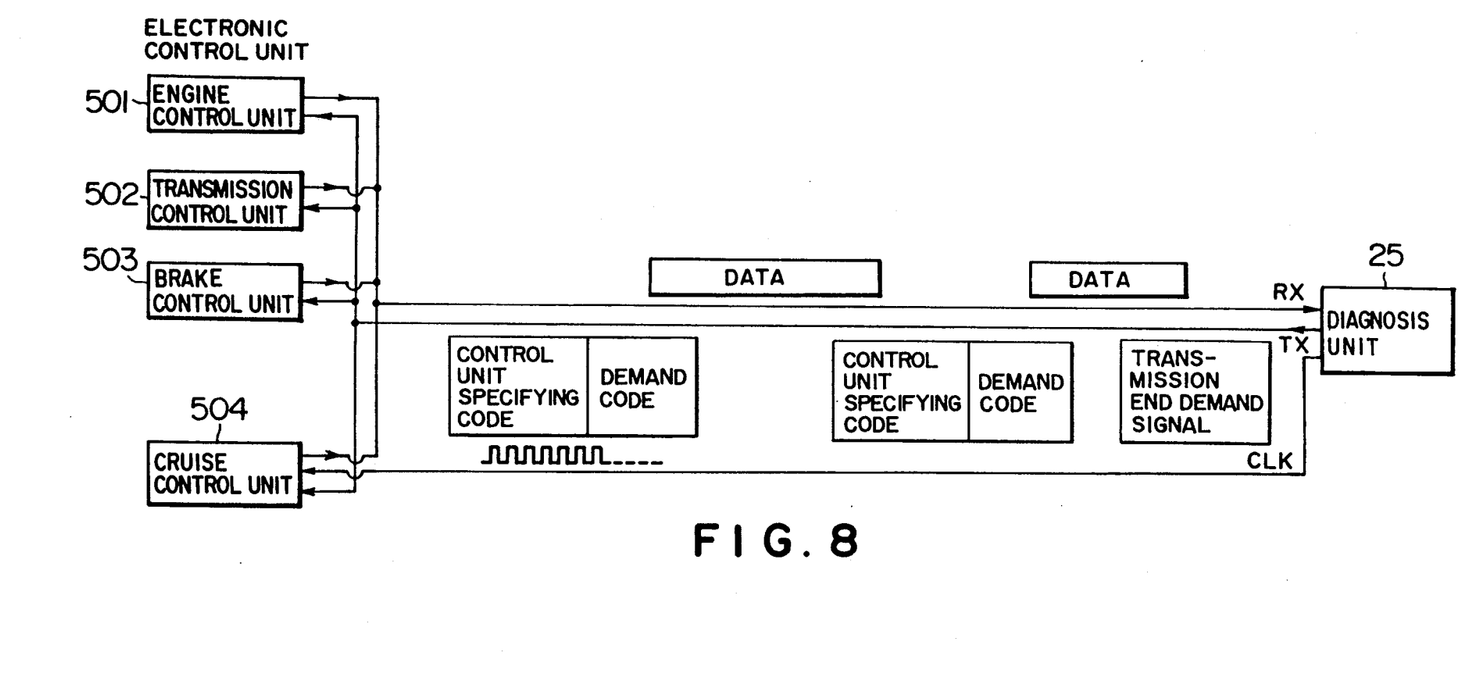
FIG. 8 is a block diagram showing data communications between the electronic control units and the diagnosis unit in the diagnosis system according to the present invention.

Meanwhile, the demand signal from the diagnosis unit 25 is transmitted from the transmission circuit 56a by the start-stop synchronous system, as shown in FIG. 8, to every ECUs 501 to 503. The demand signal comprises the control unit specifying code and the data demand code in order. Accordingly, the unit identification code demand signal is transmitted from the diagnosis unit 25 to every ECU 501 to 503 in order of an engine control unit specifying code and a unit identification code demand code.

The demand signal from the diagnosis unit 25 is received by every ECU 501 to 503 having the start-stop synchronous system. On the other hand, the ECU 504 having the clock synchronous system does not receive the demand signal because the clock signal CLK is not transmitted. The ECU 501 to 503 are interrupted to stop executing task, and operation is advanced to step 201 as shown in FIG. 7.

In step 201, the interpretation circuits 553a to 553c of the ECUs 501 to 503 determine whether or not transmission flags are "1", respectively. At the first time of the transmission demand, as the transmission flag is "0", operation is advanced to step 202.

In step 202, the interpretation circuits 553a to 553c discriminate whether or not the own transmission demand to the respective ECU 501 to 503 are transmitted. In the case of demanding the unit identification code, as the specifying code is the engine control unit specifying code, only operation of the ECU 501 is advanced from the step 202 to step 203, and operation of the ECU 502 and 503 is out of the routine of the step 202 to stop the interruption.

At this time, the ECU 502 and 503 have the flag of "0" and open the transmission line 24b of the bus 24a to the diagnosis unit 25 by the transmission circuits 555b and 555c.

The ECU 501 sets the transmission flag "1" in step 203 to output the transmission start signal from the interpretation circuit 553a to the transmission circuit 555a. When the circuit 555a is connected to the communication bus 24a, operation is advanced to step 204.

In step 204, the interpretation circuit 553a requires to the data pickup circuit 552a to read out the data of the unit identification code stored in the ROM 501c in advance. The code data is transmitted to the diagnosis unit 25 via the transmission circuit 555a.

Next, in step 205, the interpretation circuit 553a determines whether the demand to end the transmission is performed by the predetermined code input from the diagnosis unit 25 or by turning off the power switch SW4 of the diagnosis unit 25. When the demand to end the transmission is performed, in step 206, the transmission flag is "0" (namely, clarified), then the interpretation circuit 553a outputs the transmission end demand signal to the transmission circuit 555a. The transmission circuit 555a opens the transmission line 24b to the diagnosis unit 25 to end the transmission and the interruption.

On the other hand, when there is no demand to end the transmission, the transmission flag is not clarified and the interruption in the blank time of the ECU 501 continues thereby maintaining the transmission of the unit identification code.

The explanation returns to the routine of the diagnosis unit 25 again, as shown in FIG. 6. In step 104, the diagnosis unit 25 determines whether or not the data such as the unit identification code is received from the ECU 501. When the unit 25 confirms the reception of the data, operation is advanced to step 105. If the data are not received, operation returns to step 104 and the judgement is repeated.

In step 105, the CPU 36 discriminates the type of the control unit and stores the received unit identification code in the predetermined address of the RAM 37. In step 106, a table corresponding to the identification code is selected from a plurality of tables stored in the ROM 41 of the memory cartridge 34. As a result, the table corresponding to the control units of the vehicle is specified, after that, the diagnosis is performed according to the program stored in the table.

In step 107, for example, when the coolant temperature data in the ECU 501 are diagnosed in dependency on data output from the coolant temperature sensor 9, the corresponding mode is input by key operation of the keyboard 32, for example, input of "F→0→7→ENT". Then, the CPU 36 of the diagnosis unit 25 reads out the mode to temporarily store it in the predetermined address of the RAM 37. After the diagnosis mode stored in the RAM 37 is read out, the keyboard interpretation circuit 58 interprets the contents of the diagnosis mode to select the program corresponding to the diagnosis mode. At the same time, the communication circuits 56a or 56b corresponding to the diagnosis mode is respectively selected. In this case of the embodiment, the communication circuit 56a for the start-stop synchronous system is selected because of the communication with the ECU 501. The fixed data such as an abbreviation and a unit corresponding to the diagnosis mode are read out from the ROM 41 to store them in the predetermined address of the RAM 37. Then, operation is advanced to step 108.

In step 108, the data communication circuit 56a outputs the transmission demand signal $T_x$ of the data, for example, the coolant temperature data in the ECU 501, corresponding to the diagnosis mode interpreted by the circuit 58 to the communication bus 24a connecting every ECU 501 to 504 of the vehicle 500.

The transmission demand signal for the coolant temperature data in the ECU 501, as shown in FIG. 8, is transmitted to every ECU 501 to 503 via the transmission bus 24a in the order of the engine control unit specifying code and the coolant temperature data demand code by the start-stop synchronous system.

In the ECUs 501 to 503, the interruption program starts by the data transmission demand signal from the diagnosis unit 25. Since the ECUs 502 and 503 have the transmission flag "0" as aforementioned, operation is advanced from step 201 to 202. In step 202, since the control unit specifying code is the engine control unit specifying code, the program leaves from step 202 to end the interruption program.

On the other hand, since the ECU 501 is in the condition of transmitting the data of the unit identification code and keeps the transmission flag "1", operation is advanced from step 201 to step 204 so that the interpretation circuit 553a decodes that the data transmission demand signal from the diagnosis unit 25 is for the coolant temperature data. Indicating signal to pickup the coolant temperature data is output to the data pickup circuit 552a. Then, the data pick up circuit 552a stops data pickup operation of the unit identification code and picks up the coolant temperature data, so that transmitting the coolant temperature data to the diagnosis unit 25 by the transmission circuit 555a.

Meanwhile, in step 109 as shown in FIG. 6, the data communication circuit 56a receives the data signal $R_x$ output from the ECU 501.

In step 110, the data from the ECU 501 changes to the physical quantity by the calculation in the data calculation circuit 57. Namely, binary data are changed into decimal numerical data. At the same time of storing the numerical data in the predetermined address of the RAM 37, the numerical data and fixed data such as the abbreviation and unit stored in the RAM 37 in step 107 are output to the display drive circuit 59.

Figure 1B:
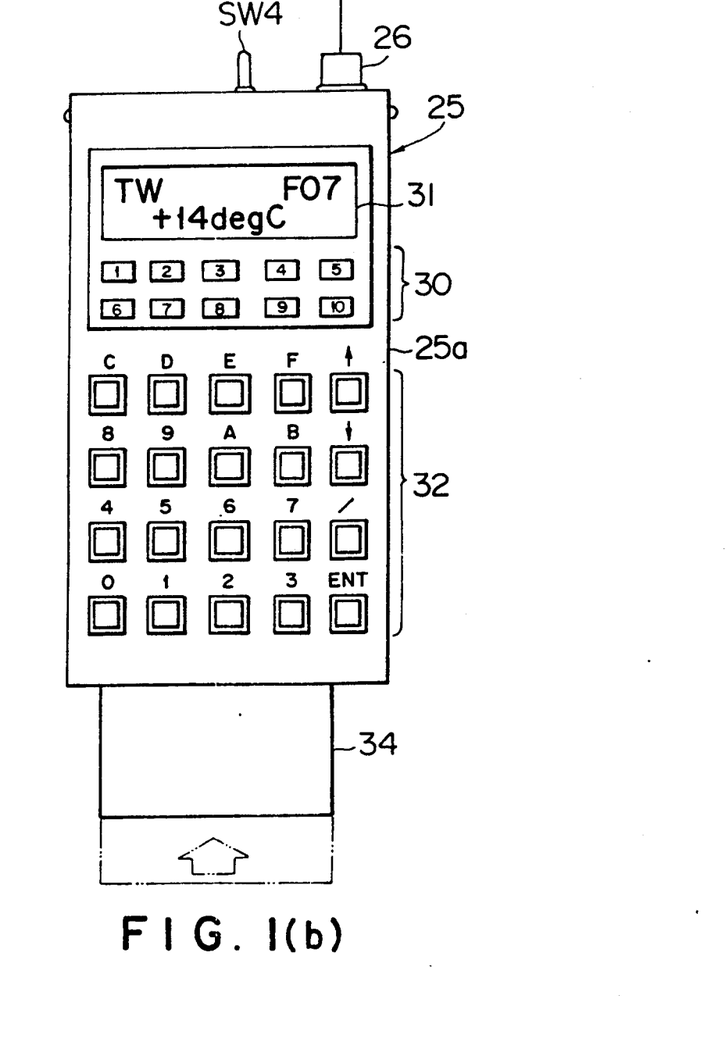
FIG. 1(b) is a plan view showing the external appearance of a diagnosis unit, according to an embodiment of the present invention.

In step 111 shown in FIG. 6, the display drive circuit 59 outputs a display signal to the display 31 to indicate the numerical data, abbreviation, diagnosis mode number (function number input by key operation), and unit on the screen of the display 31. In the diagnosis mode for the coolant temperature sensor, as shown in the screen of the display 31 of FIG. 1(b), there are indicated an abbreviation "TW" of the coolant temperature, a function number "F07", a numerical value "+14" of the coolant temperature data, and an unit "deg C". Operation then returns to step 107 and the diagnosis system awaits the next input from the keyboard.

When a new diagnosis item is executed, for example, demanded data are signals outputting to the throttle actuator 530 in the cruise control unit (the ECU 504) as other control unit without the engine control unit (the ECU 501), the interpretation circuit 58 decodes the contents of the mode input by key operation (for instance, "F→2→4→ENT") of the keyboard 32 in the aforementioned manner. When the circuit 58 determines the communication has been carried out against the ECU 504, the communication circuit 56b of the clock synchronous system corresponding to the ECU 504 is selected after the presently selected communication circuit 56a of the start-stop synchronous system output the transmission end demand signal.

Next, in step 108, the data transmission demand signal for demanding output data to the throttle actuator 530 is output from the communication circuit 56b to the ECU 504 in synchronization with the clock signal CLK corresponding to the diagnosis mode decoded by the interpretation circuit 58. The clock signal CLK is transmitted at a speed that the ECU 504 is capable of certainly receiving the demand signal. The data transmission demand signal is output to the ECU 504 in the order of the cruise control unit specifying code and the throttle actuator output data demand code.

At this time, though the ECU 501 transmits the coolant temperature data as shown in FIG. 7, the transmission end demand signal output from the communication circuit 56a of the diagnosis unit 25 is received, then the transmission end demand signal is discriminated in step 205 and operation is advanced in step 206. In step 206, the indicating signal to end the transmission is output from the interpretation circuit 553a of the ECU 501 to the communication circuit 555a by means that the transmission flag is set to "0", namely clarified, then the transmission line 24b to the diagnosis unit 25 is opened. At the same time, the transmission of the coolant temperature data from the ECU 501 to the diagnosis unit 25 is over, in dependency on the end of pickup of the coolant temperature data by the data pickup circuit 552a.

At the same time, the ECU 504 receives the data by the reception circuit 554d in synchronization with the clock signal, and starts the interruption. As the ECU 504 has the transmission flag "0", operation is advanced from step 201 to step 202 as shown in FIG. 7, then to the step 203 by the cruise control unit specifying code.

In step 203, the transmission flag of the ECU 504 is set to "1", and the transmission start signal is output from the interpretation circuit 553d of the ECU 504 to the transmission circuit 555d to communicate the transmission line 24b to the diagnosis unit 25, and then operation is advanced to step 204.

In step 204, the interpretation circuit 553d of the ECU 504 requires the data pickup circuit 552d to read out a speed set switch data. The pickup circuit 552d picks up the output data to the throttle actuator output data to transmit the data from the transmission circuit 555d to the diagnosis unit 25 in synchronization with the clock signal.

On the other hand, the diagnosis unit 25 receives the output data to the throttle actuator by the communication circuit 56b in step 109, and calculates and changes the physical quantity from the binary data to the decimal numerical data by the data calculation circuit 57 in step 110. In the step 111, the changed data are output through the display drive circuit 59 to the display 31 to indicate the numerical value of the output data to the throttle actuator.

At last, when the power switch SW4 of the diagnosis unit 25 is turned off, the communication circuit 56a or 56b outputs the transmission end demand signal. As shown in FIG. 7, operation of ECU 504 is advanced from step 205 to step 206, then the transmission flag is clarified to "0". The data transmitting ECU such as the aforementioned ECU 504 stops the data pickup operation in the pickup circuit 552d in dependency on the indicating signal to end the transmission from the interpretation circuit 553d. Next, the circuit 553d outputs the end signal to the transmission circuit 555d to open the transmission line 24b to the diagnosis unit 25, and then the data transmission of the ECU 504 is over.

The above-mentioned transmission end demand signal may be produced by inputting the predetermined transmission end demand code from the keyboard 32.

Accordingly, even though the engine control unit such as the ECU 501, the transmission control unit such as the ECU 502, the brake control unit such as the ECU 503, and the cruise control unit such as the ECU 504 have different communication systems, respectively, such as the start-stop synchronous system and the clock synchronous system corresponding to the difference of the processing ability, it is possible to diagnose the troubles corresponding to each communication system of the ECUs only by the connection between one external connector 24 and the diagnosis unit 25, and by input operation of the diagnosis mode through the keyboard 32. Therefore, it is possible to systematically diagnose the troubles common to the several units.

As aforementioned in detail, the diagnosis system according to the present invention comprises a plurality of electronic control units having different communication systems and a communication bus for interconnecting between the control units and the diagnosis unit in parallel, and one external connector provided to the bus, so that it is possible to diagnose the troubles of the vehicle by only connecting the external connector to the diagnosis unit without a plurality of communication buses to every communication systems. Namely, it is unnecessary to attach and remove the connector at every change of the communication systems, thereby facilitating diagnosis the control units having different communication systems. Accordingly, workability is extremely improved and it is easy to diagnose the troubles related to control units having different communication systems.

Furthermore, it is unnecessary to provide external connectors for every communication system of the control units and only one external connector may connect the diagnosis unit with every control unit, so that the number of parts is decreased and it is possible to reduce the production cost.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A diagnosis system for a motor vehicle, having sensing means for sensing operating conditions of the vehicle as input data, a plurality of electronic control units being responsive to the input data from the sensing means for providing output data for controlling the vehicle, independently, a diagnosis unit for sending a demand signal demanding specific data of the input and output data to the electronic control units for diagnosing the specific data and connecting means provided with a bus and a connector for connecting the diagnosis unit to the electronic control units in parallel to communicate bidirectionally, comprising:

a clock signal line connecting the diagnosis unit to at least one of the electronic control units to transmit a clock signal therebetween;

first communication means for transmitting the demand signal and the specific data between the diagnosis unit and said at least one of the electronic control units in a clock synchronous communication in synchronous to said clock signal;

second communication means for transmitting the demand signal and the specific data in a start-stop synchronous communication through the connecting means between the diagnosis unit and the other of the electronic control units;

a keyboard for inputting into the diagnosis unit a diagnosis mode designating an unit to be accessed of the electronic control units; and interpretation means for interpretating said designated unit from said diagnosis mode and for selecting one of said first and second communication means matching said designated unit so as to perform every diagnosis item dependent on different communication types at one time without disconnecting the connector.

2. The diagnosis system as set forth in claim 1, wherein said demand signal comprises a control unit specifying code identifying said designated electronic control unit, whereby each of the electronic control units enable to decide the identification of the demand signal.

3. The diagnosis system as set forth in claim 1, wherein the diagnosis unit comprises:
   calculating means for calculating a physical value of said specific data transmitted through said communication means; and
   display means for displaying said physical value.

4. The diagnosis system as set forth in claim 3, wherein the diagnosis unit comprises:
   a detachable memory cartridge detachably connected to the diagnosis unit for storing said control unit specifying code and a plurality of programs to diagnosis said specific data.

5. The diagnosis system as set forth in claim 1, wherein said at least one of the electronic control units comprises:
   synchronous means connected to said second communication means through said clock signal line for synchronizing the reception of the demand signal and the transmission of the specific data with said clock signal.

6. The diagnosis system as set forth in claim 1, wherein each of the electronic control units comprises:
   interpretation means for interpreting the content of the demand signal; and
   pickup means for picking up the specific data corresponding to the content of the demand signal from the input and output data stored in each of the electronic control units.

7. The diagnosis system as set forth in claim 1, wherein said electronic control units represent at least two of an engine electronic control unit, a transmission electronic control unit, a brake electronic control unit and a cruise electronic control unit.

* * * * *